United States Patent [19]

Hosoi

[11] Patent Number: 5,308,927
[45] Date of Patent: May 3, 1994

[54] WIRING BOARD AND A METHOD OF MANUFACTURING

[75] Inventor: Norihiro Hosoi, Osaka, Japan

[73] Assignee: Sumitomo Electric Industries, Ltd., Osaka, Japan

[21] Appl. No.: 77,959

[22] Filed: Jun. 18, 1993

Related U.S. Application Data

[63] Continuation of Ser. No. 800,066, Nov. 29, 1991, abandoned.

[51] Int. Cl.⁵ ............................................. H05K 1/09
[52] U.S. Cl. .................................... 174/256; 174/268
[58] Field of Search ............... 174/250, 255, 256, 268; 361/784

[56] References Cited

U.S. PATENT DOCUMENTS 4,424,095 1/1984 Frisch et al. .

Primary Examiner—Leo P. Picard
Assistant Examiner—Cheryl R. Figlin
Attorney, Agent, or Firm—Cushman, Darby & Cushman

[57] ABSTRACT

A wiring board, which can be efficiency produced and has excellent heat resistance, and a method of manufacturing the same. With ion-irradiation, a conductive layer and a metal layer are formed in an insulating substrate. In the vicinity of the interface between the insulating substrate and the metal layer, a composition region, which includes the atoms of the insulating substrate and the metal layer, is formed by applying ions to a metal layer formed in the insulating substrate.

12 Claims, 4 Drawing Sheets

WIRING BOARD AND A METHOD OF MANUFACTURING

This is a continuation of application Ser. No. 07/800,066, filed on Nov. 29, 1991, which was abandoned upon the filing hereof.

BACKGROUND OF THE INVENTION

1. Field of the Invention

The present invention relates to a wiring board, such as a flexible wiring board, and a method of manufacturing the same.

2. Discussion of the Prior Art

A conventional wiring board, such as a flexible wiring board, is structured so that a circuit pattern made of conductive material, for example, copper, is layered over an insulating substrate made of high polymer.

There are generally known three methods of manufacturing the wiring board: 1) substractive method, 2) additive method, and 3) semiadditive method. In the substractive method, an adhesive layer is layered on the surface of an insulating substrate, and a conductive thin film is layered on the adhesive layer. A etching resist layer with a prescribed circuit pattern is layered on the surface of the conductive thin film. The portion of the etching resist layer which is not masked is etched away, so that the necessary circuit pattern is left or formed on the insulating substrate. In the additive method, conductive material is deposited on and fixed to only the portions of a designed circuit pattern on an insulating substrate by a plating method, for example, thereby forming the circuit pattern on the insulating substrate. The semiadditive method is the combination of the substractive method and the additive method.

The wiring board is therefore formed by combining the insulating substrate and the circuit pattern, which are both made of different materials, into a one piece construction. The expansion and contraction coefficients of the wiring board are different from those of the circuit pattern. Due to the coefficient difference, warpage of the layers and separation of one layer from the other will occur when it is manufactured or used. When the wiring board is repeatedly used, the circuit pattern will be cut off due to fatigue of the metal. Dust is likely to collect on the surface of the wiring board because it contains the circuit pattern, and is, hence, uneven. Dielectric breakdown will take place in the circuit pattern. The relatively heavy weight of the circuit pattern, which is made of metal, hinders the reduction of weight of the wiring board. Use of the adhesive layer of low heat resistance, which is for bonding the circuit pattern to the insulating substrate, limits the heat resistance of the wiring board to be low.

All of the known manufacturing methods, described above, require a number of manufacturing steps, thus hindering manufacturing efficiency and a reduction of manufacturing costs.

To solve the problems of the conventional wiring board and the method of manufacturing the same, the Applicant of the present Patent Application proposed a new technique set forth in Japanese Patent Application No. Hei. 1-4125. In the proposed technique, the surface of an insulating substrate is selectively radiated with an ion beam to render conductive the portions of the substrate irradiated with the ion beam. The resultant wiring board takes the integral form of the circuit pattern and the insulating substrate.

A typical process to realize the technique is illustrated in FIG. 9(a)(PRIOR ART). As shown in FIG. 9(a), a circuit pattern mask 3 made of metal foil and having through-holes 31 formed corresponding to a circuit pattern is laid over an insulating substrate 1 made of high polymer. The surface of the insulating substrate 1 on which the circuit pattern mask 3 is laid is irradiated with ion beams. Only the portions of the insulating substrate 1 which are exposed through the through-holes 31 to ion beams are rendered conductive. Consequently, a wiring board having a circuit pattern 2, which corresponds to the circuit pattern in the surface region, is formed, as shown in FIG. 9(b)(PRIOR ART).

In the wiring board thus manufactured, at the junctions between the circuit pattern 2 and the insulating substrate 1, mixing and carbonization of substrate 1 progresses due to the ion irradiation. Each junction takes the form of a continuous phase between the different materials of the circuit pattern and the insulating substrate. Thus, the wiring board is a single uniform sheet. Therefore, the circuit pattern and the insulating substrate will not be warped and separated from each other, and dust will not collect thereon. Further, not using a metal conductor reduces the weight of the wiring board, and not using an adhesive allows the heat resistance of the wiring board to increase. In the technique proposed by the Applicant, an extended period of time is required to radiate the ion beams in order to form the circuit pattern 2. As described in the description of the preferred embodiment of the gazette, Japanese Patent Application No. Hei. 1-4125, to make polyetherimide conductive until its volume specific resistance is $3 \times 10^3$ Ωcm, a B$^+$ ion must be applied to the polyetherimide under the condition of 1.0 MV of an accelerating electric field and $3 \times 10^{17}$ ;/cm$^2$ of dosage. Therefore, it takes 7 hours for the irradiation by 2.0 μA of beam current.

High conductivity of a metal may be utilized to increase the conductivity of the circuit pattern to be formed in the insulating substrate by irradiating the insulating substrate with ions of metal, such as copper, chromium, and nickel. In this case, at least a $3 \times 10^J$/cm$^2$ dosage is required in order that metal atoms stay in the insulating substrate to allow the high conductivity of metal to be utilized. Generally, an ion-irradiating apparatus can generate a smaller dosage of metal ions than that of ions of gas, such as nitrogen and oxygen. Therefore, the technique of using the metal ions also takes a long processing time to form the circuit pattern.

As described above, the technique to form the circuit pattern in the insulating substrate by selectively irradiating the surface of the insulating substrate with ion beams takes a long time to form the insulating substrate. In this respect, the technique is poor in production efficiency. Furthermore, since the insulating board is made of high polymer, it is not suitable for a situation in which it is used for a long time at high temperature.

SUMMARY OF THE INVENTION

It is therefore an object of the present invention to provide a wiring board which may be manufactured with high efficiency and a method of manufacturing the same. Another object of the present invention is to provide a wiring board which can be used under an extended period of time and high temperature, and a method of manufacturing the same.

To achieve the above objects, a wiring board according to a first embodiment comprises an insulating substrate and a circuit pattern layered on the surface of the insulating substrate. The circuit pattern includes a conductive layer formed by irradiating the surface of the insulating substrate with ion beams and a mixing layer formed by causing metal atoms to penetrate into the insulating substrate by the ion irradiation.

In the wiring board according to the first embodiment, the circuit pattern may be formed on the surface of the insulating board, and include a metal layer. In this case, the crystal structure of a part or the whole of the metal layer has been changed by the ion irradiation.

A wiring board according to a second embodiment comprises an insulating substrate and a circuit pattern including a metal layer formed on the surface of the insulating substrate. Metal atoms constituting the metal layer are caused to penetrate into the insulating substrate by irradiating the metal layer with ions, while atoms of the insulating substrate are caused to penetrate into the metal layer. The composition of metal atoms of the metal layer and atoms of the insulating substrate lies in the vicinity of the interface between the metal layer and the insulating substrate.

In the wiring board according to the second embodiment, the crystal structure of a part or the whole of the metal layer may be changed by irradiating the metal layer with ions.

In either one of the above described wiring boards, the insulating substrates is made of inorganic material, organic polymer material, or a complex of inorganic and organic materials.

According to a third embodiment of the present invention, a method of manufacturing a wiring board comprises the steps of: forming a metal layer on the surface of an insulating substrate; irradiating the metal layer with ion beams according irradiated region of the metal layer to penetrate into the insulating substrate, or changing the crystal structure of the ion-irradiated region of the metal layer, and rendering conductive an ion-irradiated region of the insulating substrate; and etching away a region of the metal layer which is not irradiated with ion beams.

In a fourth embodiment of the present invention, a method of manufacturing a wiring board comprises the steps of: forming a metal layer on the surface of an insulating substrate; irradiating the metal layer with ion beams according to a circuit pattern, thereby causing metal atoms in an ion-irradiated region of the metal layer to penetrate into the insulating substrate, causing atoms constituting the insulating substrate to penetrate into the metal layer, or changing the crystal structure of the ion-irradiated region of the metal layer; and etching away a region of the metal layer which is not irradiated with ion beams.

In the wiring board of the first embodiment, the circuit pattern includes a conductive layer formed by irradiating the surface of the insulating substrate with ion beams, and a mixing layer formed by causing metal atoms to penetrate into the insulating substrate by the ion irradiation. High conductivity of the mixing layer increases the conductivity of the whole circuit pattern. Thus, the mixing layer greatly contributes to the increase in conductivity. Accordingly, it is not necessary to set the ion-irradiating time too long, and one time irradiation of ions suffices.

The circuit pattern may be formed on the surface of the insulating board, and may include a metal layer. In this case, the crystal structure of a part or the whole of the metal layer has been changed by the ion irradiation. Since the metal layer secures an electrical conduction, the ion-irradiation time may be short. Since the crystal structure of a part or the whole of the metal layer has been changed, the etching resistance is good.

In the wiring board of the second embodiment, a metal layer is formed on the surface of the insulating substrate. Accordingly, the metal layer secures an electrical conduction, and hence the ion-irradiation time may be short. Further, metal atoms constituting the metal layer are caused to penetrate into the insulating substrate by irradiating the metal layer with ions, while atoms of the insulating substrate are caused to penetrate into the metal layer. The composition of metal atoms of the metal layer and atoms of the insulating substrate lies in the vicinity of the interface between the metal layer and the insulating substrate. Therefore, the circuit pattern performs remarkably well in the etching resistance. Additionally, a minute difference of the thermal expansion across the interface between the metal layer and the insulating substrate provides a firm bonding of the metal layer to the insulating substrate, without using adhesive.

In any of the wiring boards mentioned above, use of a high polymer for the insulating substrate provides a satisfactory flexibility of the wiring board.

The phenomenon that the high polymer material is made conductive has been known. This is due to the fact that the high polymer is partially oxidized or reduced by the ion-irradiation (see "T. Venkatesan, et al., J. Appl. Phys. 54, 3150, June 1983).

When inorganic material is used for the insulating substrate, the good heat resistance property of the insulating substrate improves the heat resistance of the wiring board.

In the method according to the third embodiment, since the mixing layer secures a satisfactory conductivity, it is not necessary to set the ion-irradiating time too long.

A circuit pattern mask with an ion-beam passing hole configured according to a given circuit pattern is placed on the metal layer of the insulating substrate. Ions are applied to the insulating substrate through the mask. As a result, ions transmit through the metal layer to make the insulating substrate into the shape according to the circuit pattern. Ions collide with metal ions in the metal layer, either causing the metal atoms to penetrate into the insulating substrate or changing the crystal structure of the metal layer. Accordingly, the conductive layer and the mixing layer or the metal layer of which the crystal structure is changed can be formed by only two steps, namely, metal layer formation and ion-irradiation.

Ions, which impinge on the metal layer, collide with metal atoms therein to give part of their kinetic energy to the metal atoms. The kinetic energy will change the crystal structure of a part or the whole of the metal layer. When it is changed, the etching resistance of the metal layer becomes good. Most of the ions transmit through the metal layer, while maintaining their kinetic energy, and reach the insulating substrate. The ions penetrate into the insulating substrate, and collide with atoms of the insulating substrate when passing through the metal layer. At this time, the ions give their kinetic energy to the atoms to decompose the insulating material of the insulating substrate and to change the properties of the material. In case the insulating substrate is made of organic material, such as a high polymer compound, atoms other than carbon are sputtered when the ions hit the atoms of the metal layer. Accordingly, carbonization progresses in the region of the insulating substrate where the penetrated ions range.

After the irradiation of ions, the portion of the metal layer which was not irradiated with ions, because the ion beams were intercepted with the pattern mask, is removed by the etching process. The mixing layer and the metal layer where the crystal structure has changed are formed in the form of a continuous phase containing the same material a that of the conductive layer, or the crystal structure of them has changed. Therefore, those layers exhibit excellent etching resistance. The etching-away of the metal layer portion which was not irradiated can be done well. After the selective removal of the metal layer by the etching process, a wiring board is obtained in which a circuit pattern including the conductive layer and the mixing layer or the changed crystal structure metal layer is formed on the surface of the insulating substrate.

In the method of manufacturing a wiring board according to the fourth embodiment, the metal layer is formed on the surface of the insulating substrate. Accordingly, it is not necessary to set the ion irradiation time too long. A circuit pattern mask with an ion passing hole, which is formed according to a given circuit pattern, is placed on the metal layer. Then, ions are applied to the insulating substrate, through the circuit pattern mask.

Ions emitted collide with metal atoms therein to give part of their kinetic energy to the metal atoms. The metal atoms penetrate into the insulating substrate, and diffuse therein. Most of the ions transmit through the metal layer, maintain their kinetic energy, enter the interior of the insulating substrate and collide with atoms of the insulating substrate. At this time, the ions give their kinetic energy to the atoms, which enter the interior of the metal layer and diffuse thereon. In this way, a phenomenon, called ion mixing, progresses. In this phenomenon, the atoms of the metal layer enter the insulating substrate, while the atoms of the insulating substrate enter the metal layer. The region in the vicinity of the interface between the metal layer and the insulating substrate consists of a composition of the metal atoms of the metal layer and the atoms of the insulating substrate. Accordingly, a minute difference of thermal expansion occurs in the region near that interface. The metal layer and the insulating substrate may be firmly bonded together not using adhesive.

After the ion-irradiation, as in the previous case, the metal layer is selectively etched away to form a circuit pattern. With the ion-irradiation, the crystal structure of a part or the whole of the metal layer may be changed. In this case, the metal layer has a high etching resistance, providing an easy selective etching removal.

In any of the manufacturing methods mentioned above, where a circuit design requires a low resistance of the circuit pattern, the thickness of the circuit pattern may be increased in such a manner that after the etching process, the circuit pattern formed is further plated. In this case, an electrochemical plating process is preferable, which is performed using the circuit pattern as an electrode.

The high polymer and inorganic material may be used for the insulating substrate. Since the inorganic material has a high heat resistance, the wiring board based on the inorganic insulating substrate has excellent heat resistance.

DETAILED DESCRIPTION OF THE PREFERRED EMBODIMENTS

The present invention will be described with reference to the accompanying drawings.

Figure 1:
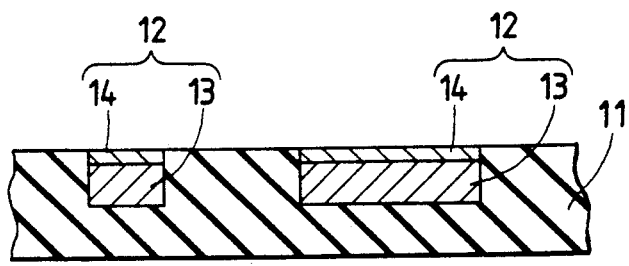
FIG. 1 is a cross sectional view showing a part of a wiring board according to the first embodiment of the present invention.

FIG. 1 is a cross sectional view showing part of a wiring board of the first embodiment of the present invention. The wiring board is a flexible wiring board of the type in which an insulating substrate 11 consists of a flexible, high polymer film. A circuit pattern 12 is formed in the surface region of one of the major surfaces of insulating substrate 11 in a manner such that ion beams are selectively applied to the surface to render conductive the ion applied portions of the substrate 11. The circuit pattern 12 consists of a conductive layer 13 formed by irradiating the high polymer material of the insulating substrate 11 with ion beams, and a mixing layer 14, which is formed on the conductive layer 13 by causing metal atoms to penetrate into the insulating substrate 11 with the irradiated ion beams.

A metal of which conductivity is equal to or larger than that of copper, such as chromium, nickel, or gold, is preferable for the metal which is to penetrate the mixing layer 14. Use of such a metal will increase the conductivity of the whole circuit pattern 12.

The wiring board formed has flat surfaces. Because of this, dust will not collect thereon, and dielectric breakdown hardly occurs in the circuit pattern 12. The flat surface of the wiring board makes it easy to bond a cover layer, for protecting the conductive circuit, to the surface by an adhesive. Further, the circuit pattern 12 is formed as the continuous phase including the same material as the substrate 11, thus causing a minute difference between the thermal expansion coefficients of the insulating substrate and the circuit pattern. Therefore, the wiring board can endure the thermal load caused when it is manufactured and used, and the mechanical load caused when it is repeatedly bent. Additionally, since no adhesive is used, if the material of good thermal resistance is used for the insulating substrate 11, a wiring board of high heat resistance can readily be realized.

In the embodiment as mentioned above, the circuit pattern 12 is formed in only one of the major surfaces of the insulating substrate 11. If required, the circuit patterns 12 may be formed in both surfaces of the insulating substrate 11. The insulating substrate 12, which is made of a single material of high polymer in the embodiment, may be made of any compound of high polymer and a filler, such as synthetic fiber and glass fiber, composite board of high polymer and a base, such as paper, glass cloth, glass mat, glass paper, and synthetic fiber, and other suitable materials. An insulating member for the multi-layered wiring board, which contains the inner layer circuits already formed, may be used for the insulating substrate. If a dosage of ion applied to part or parts of the circuit pattern 12 is appropriately adjusted so that the place has a resistance, it may be used as a resistive element. This may be realized where only the place is irradiated with weak ion beams, or vapor is not deposited with metal but irradiated with ion beams, or the place is irradiated with ion beams for a shorter time than the remaining portion.

Figure 2A:
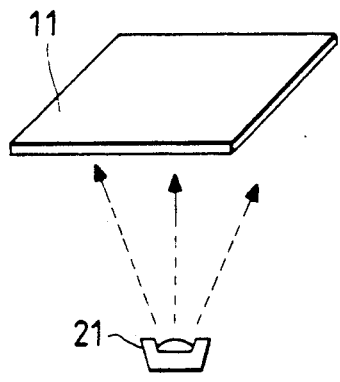
FIGS. 2(a), 2(b), 2(c) and 2(d) are diagrams showing a sequence of steps of manufacturing a wiring board for a method of manufacturing a wiring board according to the first embodiment.

FIGS. 2(a), 2(b), 2(c) and 2(d) are diagrams showing a sequence of steps to manufacture the wiring board. To start with, as shown in FIG. 2(a), copper, for example, is vaporized in a vapor source 21, and is deposited on the surface of the insulating substrate 11.

Figure 2B:
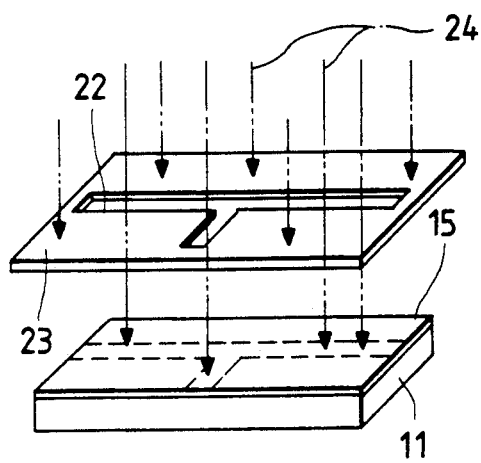

As shown in FIG. 2(b), a circuit pattern mask 23 is laid on a vapor-deposited metal layer 15 thus formed on the insulating substrate 11. Ion beams 24 are applied to the insulating substrate 11, from the back side of the circuit pattern mask 23. The circuit pattern mask 23 is a metal plate-like member with an ion-beam passing hole 22, such as a through-hole, which is configured corresponding to a circuit pattern.

Figure 2C:
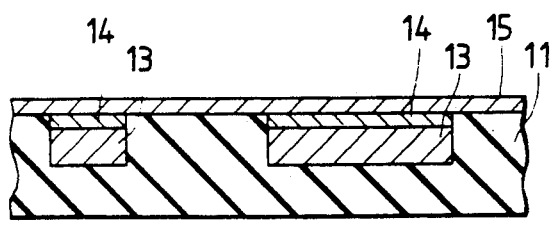

Some part of the ions, after being irradiated and passed through the circuit pattern mask 23, further pass through the metal layer 15 to penetrate into the insulating substrate 11 under the metal layer 15. The penetrated ions render the high polymer of the substrate conductive, to form a conductive layer 13. Some part of those ions collide with metal atoms of the metal layer 15, thereby forcibly pushing the metal atoms into the insulating substrate 11 thereunder. As a result, a mixing layer 14 is formed over the conductive layer 13. The above process is shown in FIG. 2(c).

Figure 2D:
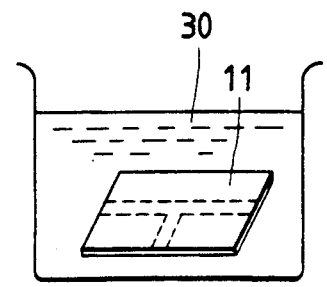

The processed insulating substrate 11 is immersed in etching solution 30 containing iron chloride (III), for example, as shown in FIG. 2(d). The portions of the metal layer 15 which lie under the nonholed portions of the circuit pattern mask 23, and therefore are not exposed to ion beams, are readily etched away (not illustrated in FIG. 2(d)). The portions of the metal layer 15 which are irradiated with ion beams 24 become corrosion proof because the metal atoms have been diffused into the substrate 11 or the atoms of the insulating substrate have been diffused into the metal layer under those portions irradiated with ions. Accordingly, under the etching conditions appropriately set, only the mixing layer 14 over the conductive layer 13 may be left, while the metal layer 15 is etched away. Specifically, as shown in FIG. 1, the circuit pattern 12 is formed in the area of the substrate, which corresponds in shape to the ion-beam passing hole 22 of the circuit pattern mask 23, and the metal layer 15 on the remaining area is removed, exposing the surface of the insulating substrate 11 to outside.

The thickness of the metal layer 15 must be designed so as to allow the ion beams 24 to pass through the metal layer. The thickness of the metal layer 15 is preferably 1500 Å or less. If the thickness of the metal layer 15 is selected to be within the above range, the ion beams 24 can be transmitted through the metal layer 15. Accordingly, the conductive layer 13 may be formed in the insulating substrate. Metal atoms in the metal layer 15 can be penetrated into the insulating substrate 11. If the thickness of the metal layer 15 exceeds the above figure, there is the possibility that the irradiated ions cannot pass through the metal layer 15. The crystal structure of the vapor deposited metal layer 15, when it is irradiated with ions, changes. The metal layer of which the crystal structure is changed exhibits excellent etching resistance characteristics. Therefore, the formation of the circuit pattern 12 using the etching process is also possible. In this case, the thickness of the deposited metal layer must be determined depending on etching time, clearness required for the circuit pattern, and the like.

Thus, a circuit pattern 12 having desired thickness and resistance may be formed by plating the circuit pattern 12. In this case, an inclined composition region extends in a wide range from the circuit pattern 12 to the insulating substrate 11. Accordingly, the wiring board having desired thickness, resistance, and excellent heat resistance may be obtained.

Ions of gas, such as argon and nitrogen, which may be readily increased in dosage (by at least $2 \times 10^{16}/cm^2$ of dosage), are preferably used for the irradiation. A large dosage of gas ions may reduce the time taken over the irradiation process of the ion beams 24. The energy to accelerate ion beams 24 is preferably 0.4 MeV or more. An accelerating energy of less than the above figure will provide insufficient irradiation effect.

Figure 3:
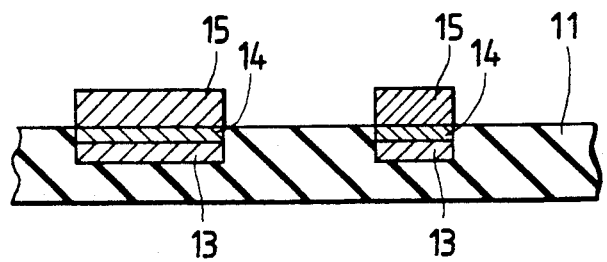
FIG. 3 is a cross sectional view showing a part of a wiring board according to another embodiment of the present invention.

The wiring board of the invention may be modified as shown in FIG. 3. As shown, another metal layer 15 is additionally layered on the surface of the insulating substrate 11 so that it lies on the mixing layer 14, which lies on the conductive layer 13. In the modification, the circuit pattern 12 exhibits a high conductivity because of the additional metal layer 15.

The method to manufacture this wiring board is the same as that shown in FIG. 2, except that the process to coat the circuit pattern 12 with etching resist ink is additionally used for etching.

Figure 4:
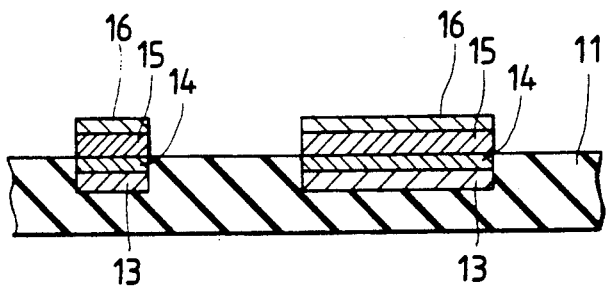
FIG. 4 is a cross sectional view showing a part of a wiring board according to a yet another embodiment of the present invention.

As shown in FIG. 4, a portion 16 which is irradiated with ion beams and the changed crystal structure thereof may occupy a part or the whole of the metal layer 15. The changed crystal structure portion 16 has a high etching resistance. Because of this, the coating step of the etching resist ink is not required for the etching process to selectively remove the metal layer 15. The etching process may be done well, and in a simple manner.

Figure 5:
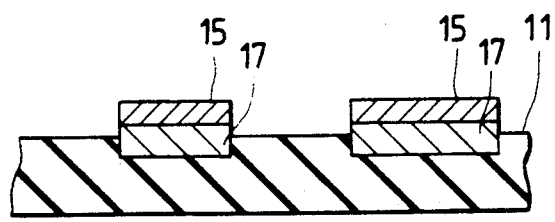
FIG. 5 is a cross sectional view showing a part of a wiring board according to an additional embodiment of the present invention.

Another modification of the wiring board of the invention is illustrated in FIG. 5. As shown, the circuit pattern 12 includes a metal layer 15 formed on the insulating substrate 11. With ion-irradiation, metal atoms constituting the metal layer 15 penetrate into the insulating substrate 11. Atoms of the insulating substrate 11 penetrate into the metal layer 15. A composition region 17 is formed in the vicinity of the interface between the metal layer 15 and the insulating substrate 11.

In this modification, the circuit pattern 12 may have a high conductivity with the aid of the metal layer 15. The high conductivity of the metal layer 15 leads to the reduction of ion beam irradiation time. In the junction of the metal layer and the insulating substrate, the composition inclined region 17 lies where the atoms coexist. With the presence of the composition region, the thermal expansion coefficient changes a little across the junction. This fact implies that the wiring board is strong enough to endure the thermal load caused when it is manufactured or used, and the mechanical load when it is repeatedly bent. Further, not using an adhesive will give the insulating substrate an excellent heat resistance if the material of high heat resistance is used for the insulating substrate 11.

Figure 6:
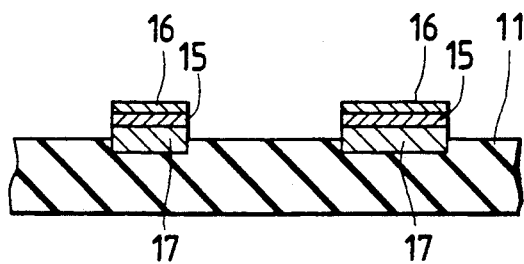
FIG. 6 is a cross sectional view showing a part of a wiring board according to a further embodiment of the present invention.

Also in this case, as shown in FIG. 6, a portion 16 which is irradiated with ion beams and the changed crystal structure thereof may occupy a part or the whole of the metal layer 15.

Figure 7A:
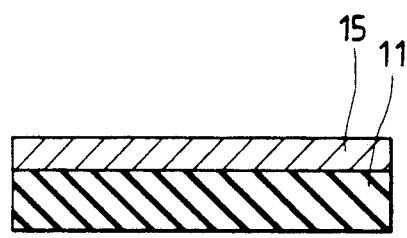
FIGS. 7(a) and 7(b) are diagrams showing steps of manufacturing a wiring board according to another method of manufacturing a wiring board.
Figure 7B:
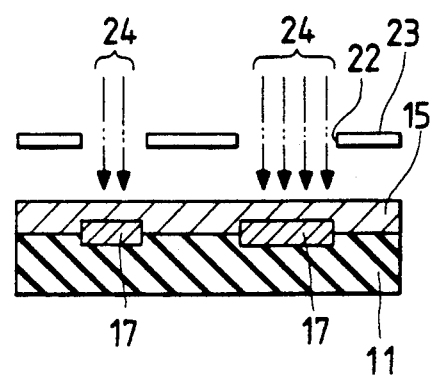

A process to manufacture the wiring board shown in FIG. 5 is diagrammatically illustrated in FIGS. 7(a) and 7(b). To start, a metal layer 15, as shown in FIG. 7(a), is formed over the surface of an insulating substrate 11. The structure consisting of the metal layer and the insulating substrate is irradiated with ion beams according to a circuit pattern. With the ion beam irradiation, metal atoms of the irradiated portion of the metal layer 15 are caused to penetrate into the insulating substrate 11, while at the same time atoms of the insulating substrate 11 are moved into the metal layer 15. As in the step of FIG. 2(d), the insulating substrate 11 is immersed in iron chloride solution, to selectively etch away the insoluble part of the metal layer 15.

In a case where a part or the whole of the metal layer 15 is changed in the crystal structure, and has a high etching resistance, the etching resist ink coating step is not required for the etching process. Therefore, the etching process may be easily and accurately accomplished.

Either inorganic material or high poly material may be used for the insulating substrate 11 of any of the wiring boards mentioned above. High polymer suitable for the insulating substrate 11 may be polyimide, resin, epoxy resin, melamine resin, or the like. Where high heat resistance is required, polyimide having the imide ring in the molecular structure is preferably used. Preferable inorganic material may be ceramic, glass or the like. Use of the inorganic material for the insulating substrate 11 will provide a wiring board of which the heat resistance is excellent.

The volume specific resistance of the insulating substrate 11 is preferably at least $10^9 \Omega cm$. If it fails to reach the figure, short circuiting is apt to occur between the adjacent conductive routes of the circuit pattern.

If required, a circuit pattern formed is further plated to be thicker. This is true for any of the wiring boards mentioned above.

The present invention will be described in more detail using examples, comparative examples, and evaluation tests.

EXAMPLE 1

Copper was vapor deposited on the surface of polyetherimide film (Kapton, trade name, manufactured by DuPont company in USA), of 25 μm thick, to form a vapor-deposited metal layer of 500 Å thick. A vapor source was of the electron beam heating type. A circuit pattern mask was applied over the metal-layer formed surface of the high polymer film. The circuit pattern mask was a stainless plate of 0.2 mm thick and with a through-hole of 50 mm in depth and 0.5 mm in width. An $Ar^+$ ion was applied to the high polymer film through the circuit pattern mask, under the condition of 1.0 MV of an accelerating electric field and $3 \times 10^{\neq}/cm^2$ of dosage. The irradiation time was approximately 2 hours and the beam current was 4 to 4.3 μA. An ion-irradiating apparatus is shown in FIG. 8.

Figure 8:
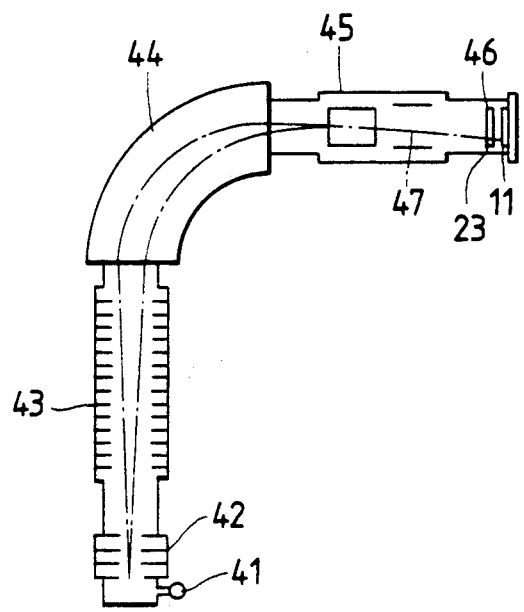
FIG. 8 is a diagram schematically showing an ion-irradiating apparatus, which is presently used for manufacturing a wiring board by the inventor this Patent Application.
Figure 9A:
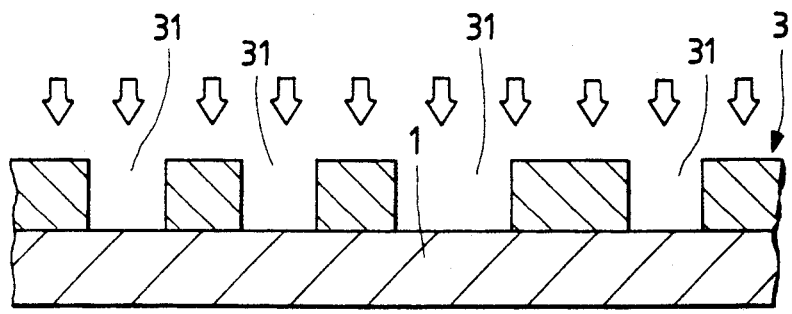
FIGS. 9(a)(PRIOR ART) and 9(b)(PRIOR ART) are diagrams useful in explaining the construction of a wiring board and a method of manufacturing the same, which have previously been proposed by the Applicant of the present Patent Application.
Figure 9B:
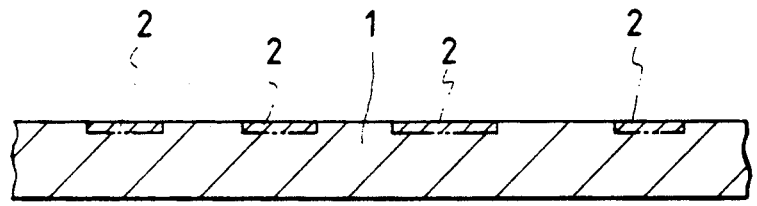

As shown in FIG. 8, the ion-irradiating apparatus is comprised of an ion source 41, a beam lead-out portion 42, an ion beam accelerator 43, a mass-separator 44, an ion beam scanner 45, and an ion irradiation chamber 46. In use, a circuit pattern mask 23 and an insulating substrate 11 (high polymer film) are set in the ion irradiating chamber 46. Ion beams 47 led out of the ion source 41 are applied to the insulating substrate 11.

The high polymer film, after being irradiated with ion beams, was immersed in iron chloride (III) solution. The areal portion of the metal layer which was masked with the circuit pattern mask and not irradiated with ion beams was instantaneously etched away. Copper in the ion irradiated area, which corresponds to the circuit pattern, exhibited a high etching resistance property and maintained a copper luster after the metal layer portion which was not irradiated had been etched away.

The lustered portion had substantially the same size as the through-hole of the circuit pattern mask. Resistance of the tested circuit pattern (0.5 mm in width and 5 cm in depth) was approximately 0.3 Ω.

EXAMPLE 2

In this example, the thickness of the vapor deposited copper layer was 800 Å. As in EXAMPLE 1, the high polymer film was irradiated with ion beams and subjected to an etching process. The result was that the areal portion of the copper deposited layer which was not irradiated with ion beams was instantaneously etched away. Copper in the ion irradiated area, which corresponds to the circuit pattern, exhibited a high etching resistance property and maintained copper luster after the metal layer portion which was not irradiated had been etched away.

Resistance of the circuit pattern obtained was approximately 0.2 Ω.

Ratios of atoms in the copper layer and in the carbonized Kapton film of the wiring boards of examples 1 and 2 were checked by the Auger spectroscope. Carbon atoms existing in the copper layer and copper atoms in the Kapton film were observed.

EXAMPLE 3

In this example, the thickness of the vapor deposited copper layer was 1000 Å. As in EXAMPLE 1, the high polymer film was irradiated with ion beams and subjected to an etching process. The result was that the areal portion of the copper deposited layer which was not irradiated with the ion beams was instantaneously etched away. Copper in the ion irradiated area, which corresponds to the circuit pattern, exhibited a high etching resistance property and maintained copper luster even after the metal layer portion not irradiated with the ion beams had been etched away.

Resistance of the circuit pattern obtained was approximately 0.14 Ω.

EXAMPLE 4

As in EXAMPLE 1, a thin copper film of 1000 Å was formed on a slide glass plate. A circuit pattern mask was placed on the copper film and a $Ni^+$ ion was applied to the copper film through the circuit pattern mask under the condition of 1.0 MV of accelerating electric field and $1 \times 10^{16}$ ions/cm² of dosage. The beam density was 8.3 to 8.5 µA. The resultant structure was immersed in an iron chloride (III) solution of 0.1N. A circuit pattern similar to the circuit pattern mask was formed.

EXAMPLE 5

A silicon nitride plate of 6 cm in depth×6 cm in width×1 mm in height was used in place of the slide glass. A circuit pattern was formed as in EXAMPLE 4. The result was the formation of a circuit pattern similar to the circuit pattern mask. The wiring boards formed in EXAMPLE 4 and EXAMPLE 5 were tested to check ratios of atoms therein. To this end, atom ratios in the insulating substrates were measured in the depth direction. Atoms of the insulating substrate were observed in the copper layer, while copper atoms were observed in the insulating substrate.

EXAMPLE 6

As in EXAMPLE 1, a thin copper film of 2000 Å was formed on a slide glass plate. A circuit pattern mask was placed on the copper film and an $O^{3+}$ ion was applied to the copper film through the circuit pattern mask under $O^{3+}$ ion's Kinetic energy 3 MeV and $5 \times 10^{16}$ ions/cm² of dosage. The beam density was 15 to 20 µA. The resultant structure was immersed in an iron chloride (III) solution of 0.1N. A circuit pattern similar to the circuit pattern mask was formed.

EXAMPLE 7

As in EXAMPLE 1, a thin copper film of 4500 Å was formed on a slide glass plate. A circuit pattern mask was placed on the copper film and an $O^{3+}$ ion was applied to the copper film through the circuit pattern mask under $O^{3+}$ ion's kinetic energy 10 MV and $1 \times 10^{\neq}$ions/cm² of dosage. The beam density was 8 to 9.5 µA. The resultant structure was immersed in an iron chloride (III) solution of 0.1N. A circuit pattern similar to the circuit pattern mask was formed.

COMPARATIVE EXAMPLE 1

A copper film of 0.2 µm thick was bonded to a polyimide film of 25 µm thick by epoxy adhesive. According to the known substractive method, the thus layered film structure was etched using the iron chloride (III) solution, to form a wiring board with a circuit pattern as formed in EXAMPLE 1.

COMPARATIVE EXAMPLE 2

A circuit pattern mask was placed on a polyimide film of 25 µm thick, and copper was vapor deposited thereover. A wiring board having a circuit pattern of 0.1 µm thick formed on the film was formed as in EXAMPLE 1.

COMPARATIVE TEST

The wiring boards formed in EXAMPLE 3, and COMPARATIVE EXAMPLE 1 and 2 were subjected to a heat cycle test, at −400° C. to 200° C.

In the wiring board of COMPARATIVE EXAMPLE 2, the circuit pattern peeled off when 400 heat cycles were reached. In the wiring board of COMPARATIVE EXAMPLE 1, the circuit pattern peeled off when 1000 heat cycles were reached.

In the wiring board of EXAMPLE 3, the circuit pattern did not peel off even at the completion of 1400 heat cycles.

As seen from the above results, the wiring board of EXAMPLE 2 is superior to the wiring boards of COMPARATIVE EXAMPLES 1 and 2, in heat resistance.

In the embodiments as mentioned above, the circuit pattern mask is the metal plate with the through-hole allowing ion beams to pass therethrough. If required, the pattern mask may be replaced with such a pattern mask that a portion of the mask, which corresponds to a circuit pattern, is made of material allowing ion beams to pass therethrough, while the remaining portion is made of material rejecting ion beams (for example, the thickness thereof is thin). A circuit pattern may be formed by scanning the insulating substrate along the circuit pattern with the ion beam, not using the circuit pattern mask.

The vapor source of the electron beam heating type, which is used for the vapor source for depositing the metal layer in the embodiments as mentioned above, may be substituted by a vapor source of the resistor heating type. Any suitable thin-film forming method, such as a sputtering method, may be used for forming the metal layer on the insulating substrate, although the vapor deposition method is used in the above-mentioned embodiment. It should be understood that the invention may be modified within the scope of the invention.

EFFECTS OF THE INVENTION

In the wiring board of the first embodiment of the present invention, a circuit pattern may be formed with one time ion-irradiation for a short time. Accordingly, the wiring board can be efficiently produced. The region between the circuit pattern and the insulating substrate takes the form of the continuous phase. This fact implies that the resultant wiring board is excellent in heat resistance, and can be used for a long time at high temperature.

In the wiring board constructed such that the circuit pattern is formed on the surface of the insulating board, and includes a metal layer, the crystal structure of a part or the whole of the metal layer having been changed by the ion irradiation, the circuit pattern has a high conductivity due to the metal layer, further reducing the ion-irradiation time. The portion of the metal layer where the crystalline structure has been changed exhibits a high etching resistance. Therefore, the remaining portion of the metal layer can readily be etched away, improving the efficiency of production.

In the wiring board of the second embodiment of the present invention, the metal layer formed in the insulating substrate carries the conduction, leading to reduction of ion-irradiation time, and hence high efficiency of production. The composition firmly connects the metal layer of the circuit pattern and the insulating substrate, without adhesive. A minute difference of the thermal expansion coefficients exists across the junction. Accordingly, the circuit pattern hardly peels from the insulating substrate. Not using adhesive results in high heat resistance of the wiring board, and hence the wiring board may be used under the condition of high temperature.

With the crystal structure of a part or the whole of the metal layer having been changed by the ion irradiation, the efficiency of production can be improved, as stated above.

In any of the wiring boards, if inorganic material is used for the insulating substrate, the heat resistance property of the resultant wiring board is improved, and the wiring board may be used in a trouble-free manner, even under the condition of high temperature.

When high polymer is used for the insulating substrate, the resultant wiring board has a good resilience, and may be used as a flexible print board.

Additionally, the manufacturing methods in the third and fourth embodiments can produce wiring boards that can be used for a long time under high temperature.

What is claimed is:

1. A wiring board, comprising:
   an insulating substrate; and
   a circuit pattern layered on a surface of said insulating substrate, said circuit pattern including a conductive layer and a mixed layer, said mixed layer being disposed on said conductive layer, a conductivity of said conductive layer being higher than that of said insulating substrate, and said mixed layer including a mixture of metal atoms and insulating substrate atoms and having a conductivity higher than that of said conductive layer.

2. The wiring method according to claim 1, in which said circuit pattern further includes a metal layer, a portion of said metal layer having a crystal structure which is more etch-resistant than the remaining portion of said metal layer.

3. A wiring board, comprising:
   an insulating substrate;
   a circuit pattern, said circuit pattern including a metal layer located on a surface of said insulating substrate; and
   an interface region located between said metal layer and said insulating substrate, said interface region having metal atoms from said metal layer and atoms from said insulating substrate.

4. The wiring board according to claim 3, in which a portion of said metal layer has a crystal structure which is more etch-resistant than the remaining portion of said metal layer.

5. The wiring board according to claim 1, in which said insulating substrate is made of inorganic material.

6. The wiring board according to claim 3, in which said insulating substrate is made of inorganic material.

7. The wiring board according to claim 1, in which said insulating substrate is made of high polymer material.

8. The wiring board according to claim 3, in which said insulating substrate is made of high polymer material.

9. The wiring board according to claim 1, wherein said insulating substrate is approximately 25 $\mu$m of at least one of polyetherimide and polyimide.

10. The wiring board according to claim 3, wherein said insulating substrate is approximately 25 $\mu$m of at least one of polyetherimide and polyimide.

11. The wiring board according to claim 1, wherein said mixing layer is copper having a thickness ranging between 500 Å and 0.2 $\mu$m.

12. The wiring board according to claim 3, wherein said mixing layer is copper having a thickness ranging between 500 Å and 0.2 $\mu$m.

* * * * *